US008415987B2

(12) United States Patent
Brueckl et al.

(10) Patent No.: US 8,415,987 B2
(45) **Date of Patent: *Apr. 9, 2013**

(54) TAP SWITCH WITH SEMICONDUCTOR SWITCHING ELEMENTS

(75) Inventors: Oliver Brueckl, Waldmunchen (DE); Dieter Dohnal, Lappersdorf (DE); Hans-Henning Lessmann-Mieske, Neutraubling (DE)

(73) Assignee: Maschinenfabrik Reinhausen GmbH, Regensburg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 12/989,441

(22) PCT Filed: Aug. 27, 2008

(86) PCT No.: PCT/EP2008/007002

§ 371 (c)(1), (2), (4) Date: Dec. 2, 2010

(87) PCT Pub. No.: WO2010/022750

PCT Pub. Date: Mar. 4, 2010

(65) Prior Publication Data

US 2011/0133817 A1 Jun. 9, 2011

(51) Int. Cl.
*H03K 3/00* (2006.01)

(52) U.S. Cl.
USPC .......................................... 327/108; 327/434

(58) Field of Classification Search .................. 327/432, 327/433, 434, 108
See application file for complete search history.

(56) References Cited

U.S. PATENT DOCUMENTS

| | | | | |
|---|---|---|---|---|
| 5,969,511 | A | 10/1999 | Asselman et al. | |
| 6,593,781 | B2 * | 7/2003 | Yoshimura | 327/110 |
| 7,355,369 | B2 * | 4/2008 | Lavieville et al. | 323/255 |
| 2011/0102056 | A1 * | 5/2011 | Brueckl et al. | 327/478 |

FOREIGN PATENT DOCUMENTS

| | | | |
|---|---|---|---|
| GB | 2424766 | A | 10/2006 |
| WO | 0122447 | A | 3/2001 |

* cited by examiner

*Primary Examiner* — Hai L Nguyen
(74) *Attorney, Agent, or Firm* — Andrew Wilford

(57) ABSTRACT

An on-load tap changer with semiconductor IGBT switching elements for uninterrupted switching over between winding taps of a tapped transformer, has two load branches connectable with the respective winding taps and each load branch is electrically connected with a common load output line through a respective series circuit consisting of two oppositely connected IGBTs. A diode is connected parallel to each IGBT, and the two diodes in each load branch are connected oppositely to one another. A respective mechanical switch is connected in series with the series circuit of IGBTs and parallel diodes in each load branch. A respective varistor is connected parallel to each parallel circuit of IGBT and diode, and the varistors are so dimensioned that the respective varistor voltages are lower than the maximum blocking voltage of the respective parallel IGBTs but higher than the maximum instantaneous value of the tap voltage.

4 Claims, 2 Drawing Sheets

TAP SWITCH WITH SEMICONDUCTOR SWITCHING ELEMENTS

CROSS REFERENCE TO RELATED APPLICATIONS

This application is the US-national stage of PCT application PCT/EP2008/007002, filed 27 Aug. 2008, published 4 Mar. 2010 as WO2010/022750, and claiming the priority of PCT patent application PCT/EP2008/007002 itself filed 27 Aug. 2008.

FIELD OF THE INVENTION

The invention relates to an on-load tap changer with semiconductor switching elements for uninterrupted switching over between winding taps of a tapped transformer.

BACKGROUND OF THE INVENTION

An on-load tap changer with semiconductor switching elements that is constructed as a hybrid IGBT switch is known from WO 2001/022447. The on-load tap changer described there operates according to the principle of a continuous load switch, in which it is possible to dispense with a force store. As hybrid switch, it has a mechanical part and an electrical part. The mechanical part, which is the actual subject of WO 2001/022447, has mechanical switch contacts; the central part is a movable slide contact that is moved by means of a motor drive along a contact guide rail connected with the neutral point and in that case connects stationary contact elements. The actual load changeover itself is carried out by two IGBTs each with four diodes in rectifier-circuit arrangement. This known concept of a hybrid switch is mechanically complicated and demanding in order to ensure the necessary load changeover precisely at the zero transition of the load current.

A further IBGT switching device in which the taps of the regulating winding of a power transformer are connected with a common load shunt by way of a series connection of two IGBTs is known from WO 1997/005536 [U.S. Pat. No. 5,969,511]. This known switching device operates according to the principle of pulse width modulation; in that case, limitation of the circular current takes place by the transient reactive reactance (TER) of the tapped winding. This known switching arrangement and the underlying switching principle require specific adaptation of the on-load tap changer to the respective tapped transformer that is to be connected. In other words, tapped transformer and on-load tap changer are matched to one another and interact electrically. This known switching device is thus not able to be produced as a separate, universally usable apparatus.

Finally, various switching arrangements for an on-load tap changer, which include varistors connected in various ways, are known from GB 2424766. In one form of embodiment, varistors are connected parallel to the respective switching elements and serve for voltage dividing.

OBJECT OF THE INVENTION

It is the object of the invention to indicate an on-load tap changer of the kind stated in the introduction that is of simple construction and has a high level of functional reliability and in which there is no requirement for switching to be precisely at the zero transition of the load current. Moreover, it is an object of the invention to indicate such an on-load tap changer that does not have to be adapted specifically to the respective rated load current and the respective windings of the tapped transformer to be connected, but can be connected quasi "off the shelf" as a functionally capable apparatus to the most diverse tapped transformers.

SUMMARY OF THE INVENTION

This object is attained in that two switching units each consist of two associated antiparallel IGBTs. Associated with each individual IGBT is a varistor connected in parallel therewith. The varistor is in that case so dimensioned that the varistor voltage is lower than the maximum blocking voltage of the respective parallel IGBTs, but higher than the maximum instantaneous value of the tap voltage.

With particular advantage the two associated IGBTs of an antiparallel switching unit are clamped together in the form of a compact stack.

Moreover, it is particularly advantageous to position the respective varistor in the sense of a parallel path that has as a low as possible inductance, directly adjacent to each IGBT and to integrate it in the stack. It is possible in this manner to realize extremely short conductive connections between IGBT and the parallel arranged varistor. This arrangement also makes possible, in the case of a full instantaneous value of the load current, a very rapid "hard" switching-off of the load current, which flows by way of the IGBT, by commutation within 0.1 . . . 1 μsec to the varistor that is connected with extremely low inductance and that itself has only an extremely small response delay time in the nanosecond range.

The "hard switching" of the IGBT decisively reduces the switch-off loss energy converted in the IGBT and makes possible for the first time—as subsequently explained in detail—the switching concept here present of an on-load tap changer (OLTC) switching over at any desired value of the instantaneous load current without an additional transition impedance in the OLTC, without the necessity of knowing the leakage reactance of the tapped winding, without the need for adaptation of the OLTC to the respective rated load current or the tap voltage and without the necessity of matching, with microsecond precision in time, of the IGBT switching group switching off and that taking over.

Varistors in conjunction with IGBTS are indeed known from DE 101 18 743 A1 and numerous other publications. However, in the prior art they serve exclusively for the purpose of protecting is semiconductors from over-voltages, thus have merely a voltage-limiting function.

Thereagainst, in the case of the invention the function of the varistor arranged parallel to each IGBT is different: after commutation of the imposed load current, which is formed by the mains voltage, from the IGBT that is switching off to the varistor lying in parallel (small commutation circuit), the varistor flowed through by the load current builds up—in correspondence with its I-U characteristic—a voltage that exhibits a relatively small dependence on the instantaneous value of the current and that remains virtually constant during the switching-over process of the OLTC.

The varistors are in that case, with particular advantage, so dimensioned that the varistor voltage which results when loaded with the peak value of the maximum current still has a sufficient safety margin to the maximum blocking voltage of the IGBTs. On the other hand, the clamping voltage of the varistors ($U_{var}$ at 1 milliamp) must lie significantly above the peak value of the maximum tap voltage so that the load current can be commutated from the OLTC side that is switching off, via the tap voltage to the side taking over the load current (large commutation circuit).

The difference ΔU between instantaneous value of the voltage drop at the varistor and the instantaneous value of the tap voltage causes, through the special dimensioning of the varistors, commutation of the load current by way of the leakage inductance of the tap winding and the line inductances on the side of the on-load tap changer taking over and determines the di/dt of the commutation process ($di/dt=\Delta U/L_{com}$).

This means that the varistors within the scope of the present invention are not used, as in the prior art, for reducing transient over-voltages. In the present invention the varistors take over the following functions that are non-typical for their category and that are not suggested by the prior art:

taking over the load current from the IGBTs switching off hard, generating a voltage drop that, independently of the instantaneous value of the load current, has to lie in a voltage band between the maximum blocking voltage of the IGBTs and the peak value of the maximum tap voltage, and providing a voltage/time area that commutates the load current from the current-conducting side of the on-load tap changer by way of the oppositely directed tap voltage to the on-load tap changer side taking over.

A very simple and economic dimensioning of the electronic power switching groups arises by virtue of the invention, because the energy-receiving volume in the case of the varistor is flexibly variable and is unequal to and greater than the much smaller and more expensive volume, which is capable of volume variation only with difficulty, of the IGBT chips. As a further positive effect of the load current conductance through the varistors, the is provision of the required commutation voltage/time area by way of the varistors and acceptance of the then-arising loss energy similarly by the varistors, a very large tolerance field arises with respect to the synchronisation of the switch-off time instant of the IGBT group switching off and the switch-on time instant of the IGBT group taking over.

If in the course of the operating year an overlapping or gapped changeover behavior in an order of magnitude of approximately ±10 μsec should arise due to component ageing and shift in operating point in the electronic activating system, there is no resulting risk to function in the switching concept according to the invention.

In summary, the invention has the following advantages:

option of switching over at any desired instantaneous value of the load current without thermal overloading of the IGBTs, extraordinarily rapid commutation process of the load current from the on-load tap changer side A in the direction of B or B in the direction of A within approximately 10 μsec, avoidance of disruptive oscillations, order-specific adaptation of each on-load tap changer to the actual rated tap data of the order details (tap voltage, rated transient current, leakage inductance) is redundant as long as the limit values of tap voltage and rated transient current are not exceeded, and robust, intrinsically reliable is commutation concept with a very large tolerance range with respect to switching time drift between the two IGBT switching groups, no readjustment after a longer period of operation being required.

BRIEF DESCRIPTION OF THE DRAWING

The invention will be explained in more detail by way of example on the basis of figures, in which.

DETAILED DESCRIPTION OF THE INVENTION

Figure 1:
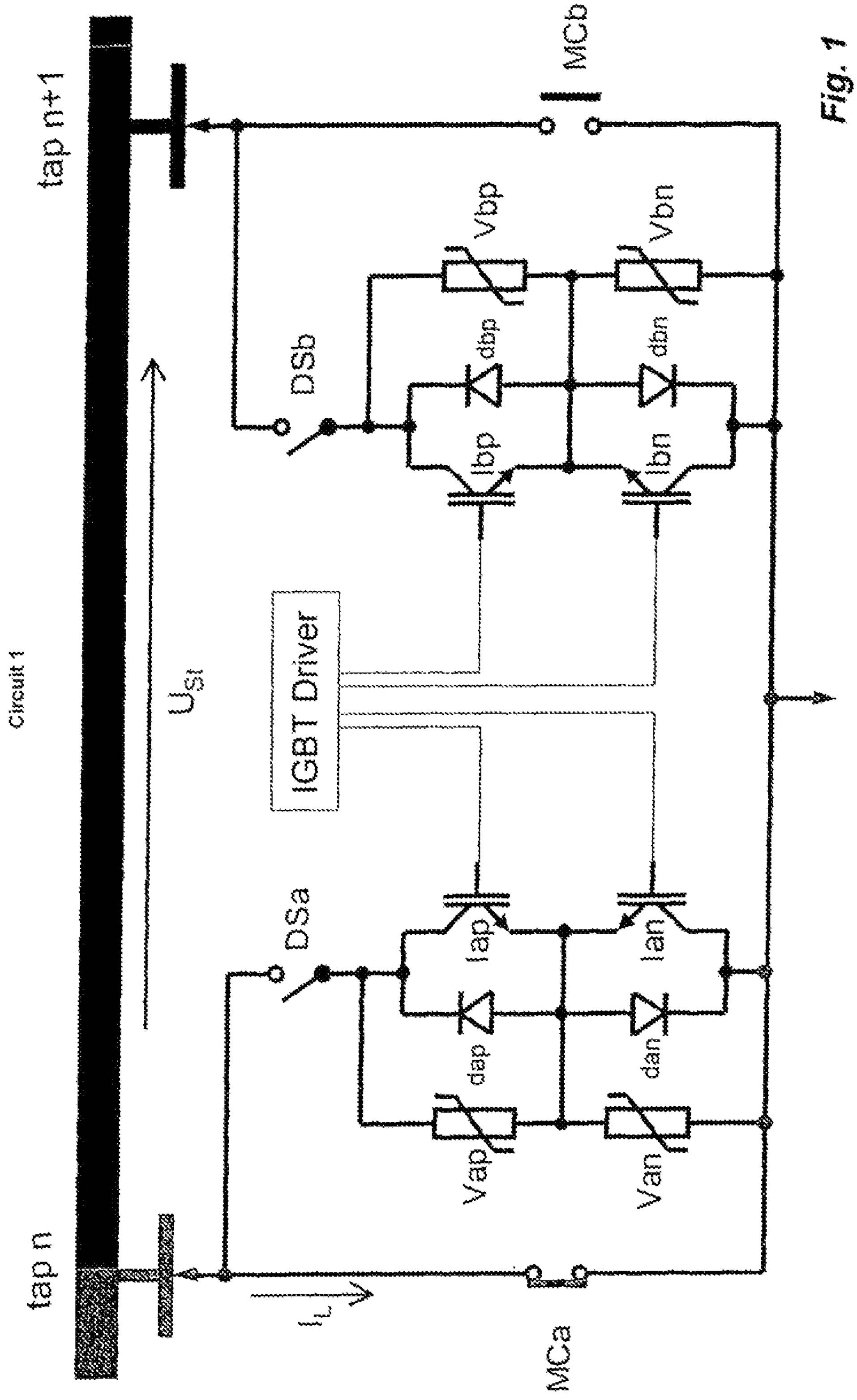
FIG. 1 shows the circuit of a first on-load tap changer according to the invention and FIG. 2 shows the circuit of a second on-load tap changer modified within the scope of the invention.

As illustrated in FIG. 1, each of the two winding taps tap n as well as tap n+1 is connected with the on-load tap changer output line by way of a mechanical switch $DS_a$ or $DS_b$ by a series circuit consisting of, respectively, two oppositely connected IGBTs $I_{an}$ and $I_{ap}$ on the side n and $I_{bn}$, and $I_{bp}$ on the side n+1. respective diode $d_{an}$, $d_{ap}$ or $d_{bn}$, $d_{bp}$ is connected parallel to each of the two serially connected IGBTs $I_{an}$, and $I_{ap}$ of one side and $I_{bn}$ and $I_{bp}$ of the other side. In that case, the diodes of the same side, i.e. $d_{an}$ and $d_{ap}$ or $d_{bn}$ and $d_{bp}$, are connected oppositely to one another, i.e. with opposite pass direction.

Moreover, a respective varistor $V_{an}$, $V_{ap}$ or $V_{bn}$, $V_{bp}$ is connected parallel to each of these parallel connections of IGBT and diode. Finally, the main latching contacts $MC_a$ and $MC_b$, which respectively bridge over the entire switching arrangement in is steady-state operation, of each side are also illustrated. The IGBTs of the two sides $I_{an}$, $I_{ap}$; $I_{bn}$, $I_{bp}$ are driven by a common IGBT driver that is illustrated only schematically and that is known from the prior art.

In the following, a changeover sequence from, for example, tap n to tap n+1 is to be explained in more detail: in the basic position the load current flows by way of the main latching contact $MC_a$ from tap n to on-load tap changer output line Y.

As a first step of the changeover sequence the free-switching contacts $DS_a$ and $DS_b$ are closed.

Subsequently, ignition voltage is applied to the gates of the IGBTs $I_{an}$ and $I_{ap}$. The main latching contact MCa now opens and commutates the load current $I_L$ to the IGBT group $I_{an}/I_{ap}$. After less than 10 msec of current flow duration of IL via the IGBT group $I_{an}/I_{ap}$ these IGBTs receive a switch-off command and the IGBT group $I_{bn}/I_{bp}$ receives at the same time (at least in the standard case) a switch-on command. The voltage building up at the IGBT switching off transfers to the varistor lying in parallel. When after a few 100 nanoseconds the clamping voltage of the varistor is reached, the varistor begins to conduct, whereby take-over of the load current from the IGBTs $I_{an}$ and $I_{ap}$ occurs.

According to the invention the varistor is so dimensioned that the voltage of the varistor flowed through by load current on the one hand moves below the maximum blocking voltage of the parallel IGBTs and on the other hand above the maximum instantaneous value of the tap voltage. The excess of the instantaneous value of the varistor voltage above the instantaneous is value of the tap voltage causes downward commutation of the load current at approximately constant di/dt from side A and pushing over by way of the tap voltage and leakage inductance of the tapped winding $L_a$ (large commutation circuit) at the same di/dt (in this case positive) to the side B. Notwithstanding the continuously reducing current flowing through the varistor on side A, the varistor voltage remains constant to a first approximation.

After approximately 10 μsec the entire load current is commutated over from the varistor of the side A flowed through by current to the conductive IGBTs of the side B. With approximation of the current of side A to the value 0, the voltage at the switching group A basically changes:

The varistor voltage collapses, overcomes the transient $L_\sigma(di/dt)$ and appearing at the IGBT/varistor group A is the tap voltage, which depending on the polarity arises at one blocking IGBT, the diode lying in parallel therewith and the respective varistor again lying in parallel. Even in the case of a load at the peak value of the tap voltage, the varistor does not allow any significant current flow.

Less than 10 msec after the electronic power commutation of the load current from side A to side B the main latching contact MCb closes and shunts the IGBT group B. The IGBTs $I_{bn}/I_{bp}$ are subsequently switched by way of the gate drive to the non-conductive state. The changeover sequence ends with opening the mechanical free-switching contacts $DS_a$ and DSb that protect the IGBTs from the transient voltage loads that can be effective at the tap winding.

Figure 2:
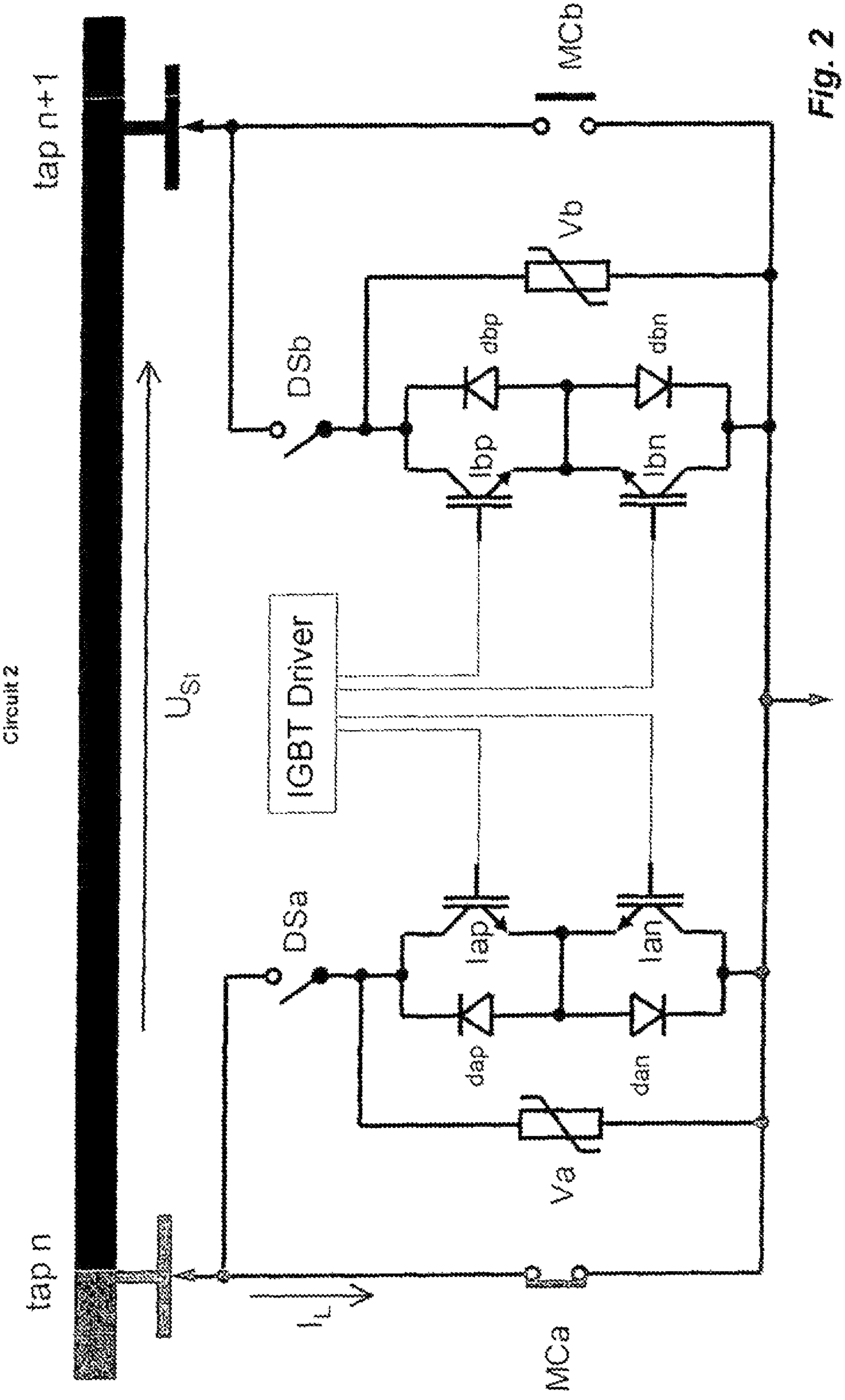

A modified circuit of an on-load tap changer according to the invention is illustrated in FIG. 2, in which the two varistors of a respective side $V_{an}$, $V_{ap}$ or $V_{bn}$, $V_{bp}$ are combined to form a respective common varistor $V_a$ or $V_b$. In that case the respective mechanical switch of each side $DS_a$ or DSb and the respective varistor $V_a$ or $V_b$ of the associated side similarly form a series connection towards the common load shunt.

The invention claimed is:

1. An on-load tap changer with semiconductor switching elements for uninterrupted switching over between winding taps of a tapped transformer, wherein the on-load tap changer has two load branches connectable with the respective winding taps, the semiconductor switching elements are IGBTs, each of the two load branches is electrically connected with a common load output line through a respective series circuit consisting of two oppositely connected IGBTs, a diode is connected parallel to each IGBT, the two diodes in each load branch being connected oppositely to one another, a respective mechanical switch is connected in series with the series circuit of IGBTs and parallel diodes in each load branch, a respective varistor is connected parallel to each parallel circuit of IGBT and diode, and the varistors are so dimensioned that the respective varistor voltages are lower than the maximum blocking voltage of the respective parallel IGBTs but higher than the maximum instantaneous value of the tap voltage.

2. The on-load tap changer according to claim 1, wherein each IGBT is constructionally combined to form a stack together with the varistor connected in parallel therewith and the respective diode.

3. The on-load tap changer according to claim 1, wherein the two varistors provided in each load branch are combined to form a single varistor.

4. The on-load tap changer according to claim 1, further comprising a respective mechanical main latching contact is provided parallel to each of the two load branches.

* * * * *